United States Patent
Yoshihara et al.

(10) Patent No.: US 8,414,972 B2
(45) Date of Patent: Apr. 9, 2013

(54) COATING TREATMENT METHOD, COATING TREATMENT APPARATUS, AND COMPUTER-READABLE STORAGE MEDIUM

(75) Inventors: Kousuke Yoshihara, Koshi (JP); Tomohiro Iseki, Koshi (JP); Koji Takayanagi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/530,345

(22) PCT Filed: Feb. 28, 2008

(86) PCT No.: PCT/JP2008/053503
§ 371 (c)(1),
(2), (4) Date: Sep. 8, 2009

(87) PCT Pub. No.: WO2008/111400
PCT Pub. Date: Sep. 18, 2008

(65) Prior Publication Data
US 2010/0112209 A1  May 6, 2010

(30) Foreign Application Priority Data
Mar. 15, 2007 (JP) .................... 2007-066499

(51) Int. Cl.
*B05D 3/12* (2006.01)
(52) U.S. Cl. .......... 427/240; 427/425; 427/427.3; 118/52; 118/320; 118/321; 438/780; 438/782
(58) Field of Classification Search ............ 427/240, 427/425, 427.3; 118/52, 320, 321; 438/758, 438/780, 782
See application file for complete search history.

(56) References Cited

U.S. PATENT DOCUMENTS 5,405,813 A * 4/1995 Rodrigues .......... 438/782
5,912,049 A * 6/1999 Shirley ............ 427/240
(Continued)

FOREIGN PATENT DOCUMENTS

| JP | 10-092734 | 4/1998 |
| JP | 10-151406 | 6/1998 |

(Continued)

OTHER PUBLICATIONS

Japanese Office Action issued Oct. 10, 2011 in patent application No. 2010-053546 with English translation.

(Continued)

*Primary Examiner* — Kirsten Jolley
(74) *Attorney, Agent, or Firm* — Oblon, Spivak, McClelland, Maier & Neustadt, L.L.P.

(57) ABSTRACT

In a coating step, a substrate is rotated at a high speed, and in that state a resist solution is discharged from a first nozzle to a central portion of the substrate to apply the resist solution over the substrate. Subsequently, in a flattening step, the rotation of the substrate is decelerated and the substrate is rotated at a low speed to flatten the resist solution on the substrate. In this event, the discharge of the resist solution by the first nozzle in the coating step is performed until a middle of the flattening step, and when the discharge of the resist solution is finished in the flattening step, the first nozzle is moved to move a discharge position of the resist solution from the central portion of the substrate. According to the present invention, the resist solution can be applied uniformly within the substrate.

8 Claims, 14 Drawing Sheets

U.S. PATENT DOCUMENTS

| | | | | |
|---|---|---|---|---|
| 6,117,486 A | * | 9/2000 | Yoshihara | 427/240 |
| 2008/0069948 A1 | * | 3/2008 | Yoshihara et al. | 427/240 |

FOREIGN PATENT DOCUMENTS

| | | |
|---|---|---|
| JP | 11 260717 | 9/1999 |
| JP | 11 297586 | 10/1999 |
| JP | 2001-307984 | 11/2001 |
| JP | 2003-93955 | 4/2003 |
| JP | 2005 21803 | 1/2005 |
| JP | 2006-156565 | 6/2006 |

OTHER PUBLICATIONS

Office Action issued Sep. 13, 2010 in Chinese Application No. 200880008386.3 (With Englsih Translation).

Office Action issued Nov. 2, 2011 in Chinese Application No. 200880008386 3 (With Englsih Translation).

Japanese Office Action issued Sep. 20, 2011, in Patent Application No. 2008-027410 (with English-language translation).

* cited by examiner

COATING TREATMENT METHOD, COATING TREATMENT APPARATUS, AND COMPUTER-READABLE STORAGE MEDIUM

TECHNICAL FIELD

The present invention relates to a coating treatment method, a coating treatment apparatus, and a computer-readable storage medium.

BACKGROUND ART

In a photolithography process in a manufacturing process of a semiconductor device, for example, a resist coating treatment of applying a resist solution onto a wafer to form a resist film, exposure processing of exposing the resist film to a predetermined pattern, a developing treatment of developing the exposed resist film and so on are performed in sequence to form a predetermined resist pattern on the wafer.

In the above-described resist coating treatment, a so-called spin coating method is widely used in which a resist solution is applied over a front surface of a wafer by supplying a resist solution from a nozzle to a central portion of the wafer rotated at a high speed and diffusing the resist solution on the wafer by centrifugal force. Further, in this spin coating method, as a method of applying the resist solution more uniformly, a method has been proposed in which, for example, after the supply of the resist solution to the wafer rotated at a high speed is finished, the rotation of the wafer is once decreased to flatten the resist solution on the wafer, and the rotation of the wafer is then increased again to dry the resist solution on the wafer (see Patent Document 1).
[Patent Document 1]
Japanese Patent Application Laid-open No. Hei 11-260717

DISCLOSURE OF THE INVENTION

Problems to be Solved by the Invention

As the miniaturization of circuits of semiconductor devices progresses, the resist film is made thinner in the photolithography. To form a resist film of, for example, 150 nm or less thinner than that in the prior art by using the above-described spin coating method, it is conceivable to use a resist solution having a relatively low viscosity that is apt to diffuse on the front surface of the wafer. However, the resist solution having the low viscosity has a high percentage of solvent and thus is apt to diffuse but dry, so that the resist solution will quickly dries while it is diffusing on the front surface of the wafer. Therefore, the final coating state of the resist solution becomes susceptive to the discharge state of the resist solution from the nozzle, so that it is conceivable that, for example, even when the discharge state of the resist solution slightly becomes uneven, the coating mottles different in thickness are generated on the front surface of the wafer. Especially when the coating is performed using a small amount of resist solution in order to reduce the amount of the expensive resist solution used, the coating mottles will prominently appear.

Actually, the inventors used a resist solution having a low viscosity and applied the resist solution onto a wafer, and then conducted an experiment of measuring the thickness of the resist solution within the wafer at that time. As a result, it was found that a large fluctuation occurred in the thickness of the resist solution near a center of the wafer as shown in FIG. 16. This can be considered to be caused from a bad dripping property of the resist solution R when the discharge of the resist solution R from the nozzle N is finished as shown in FIG. 17 because the resist solution has the low viscosity so that a droplet R1 of the resist solution finally drops to the central portion of the wafer W. Thus, it is believed that if a resist solution having a low viscosity is used, the discharge state of the resist solution immediately before the finish of the discharge becomes unstable to cause the coating mottles.

Unless the resist solution is uniformly applied on the wafer without mottles, for example, the focus in the exposure processing will deviate to finally fail to formation of a resist pattern in a desired dimension on the wafer.

The present invention has been developed in consideration of the above points, and an object thereof is to apply a coating solution uniformly within a substrate even when the spin coating method is used to apply the coating solution such as a resist solution having a low viscosity onto the substrate such as a wafer.

Means for Solving the Problems

A present invention to achieve the above object is a coating treatment method for a substrate, including: a first step of discharging a coating solution from a nozzle to a central portion of the substrate with the substrate being rotated at a relatively high speed to apply the coating solution over the substrate; a second step of decelerating, after the first step, the rotation of the substrate and rotating the substrate at a relatively low speed; and a third step of accelerating, after the second step, the rotation of the substrate to dry the coating solution on the substrate. In addition, the discharge of the coating solution by the nozzle in the first step is continuously performed until a middle of the second step, and when the discharge of the coating solution is finished in the second step, the nozzle is moved to move a discharge position of the coating solution from the central portion of the substrate.

According to the present invention, even when the last coating solution dropping from the nozzle is in a droplet, the coating solution in the form of droplet is never instantaneously dried because the rotation speed of the substrate at the time of dropping of the droplet is a low speed. In additions, the drop position of the droplet of the coating solution is shifted from the central portion of the substrate, and therefore the centrifugal force strongly exerts thereon, so that the dropped droplet is appropriately spread on the substrate. As a result of this, the coating mottles caused from the drop of the droplet of the coating solution are suppressed, whereby the coating solution can be finally applied uniformly within the substrate.

The movement of the nozzle may be started concurrently with finish of the first step. Note that "concurrently" herein also includes substantially concurrently within 0.5 seconds before and after the finish of the first step.

Further, the rotation speed of the substrate at the time of movement of the nozzle may be set at 1000 rpm or less. Furthermore, the discharge position of the coating solution may be shifted from the central portion of the substrate by 5 mm or more.

Further, the coating treatment method may further include a fourth step of discharging, before the first step, the coating solution from the nozzle to the central portion of the substrate with the substrate being rotated at a speed lower than the rotation speed of the substrate in the first step. The rotation speed of the substrate in the fourth step may be lower than the rotation speed of the substrate in the second step.

The present invention according to another aspect is a coating treatment method for a substrate, including: a first step of discharging a coating solution from a nozzle to a central portion of the substrate with the substrate being acceleratingly rotated at a fixed acceleration until the rotation reaches a relatively high speed to apply the coating solution over the substrate; a second step of decelerating the rotation of the substrate immediately after the rotation speed of the substrate reaches the relatively high speed and rotating the substrate at a relatively low speed; and a third step of accelerating, after the second step, the rotation of the substrate to dry the coating solution on the substrate. In addition, the discharge of the coating solution by the nozzle in the first step is continuously performed until a middle of the second step, and when the discharge of the coating solution is finished in the second step, the nozzle is moved to move a discharge position of the coating solution from the central portion of the substrate.

The present invention according to another aspect is a coating treatment apparatus for a substrate, including: a rotating and holding unit for holding the substrate and rotating the substrate at a predetermined speed; a nozzle for discharging a coating solution to the substrate at a predetermined timing; and a nozzle moving mechanism for moving the nozzle in a radial direction of the substrate from a position above a central portion of the substrate. The coating treatment apparatus further includes a control unit for controlling operations of the rotating and holding unit, the nozzle and the nozzle moving mechanism to execute a first step of discharging the coating solution from the nozzle to the central portion of the substrate with the substrate being rotated at a relatively high speed by the rotating and holding unit to apply the coating solution over the substrate; a second step of decelerating, after the first step, the rotation of the substrate and rotating the substrate at a relatively low speed; and a third step of accelerating, after the second step, the rotation of the substrate to dry the coating solution on the substrate, wherein the discharge of the coating solution by the nozzle in the first step is continuously performed until a middle of the second step, and when the discharge of the coating solution is finished in the second step, the nozzle is moved to move a discharge position of the coating solution from the central portion of the substrate.

The movement of the nozzle in the coating treatment apparatus may be started concurrently with finish of the first step. Further, the rotation speed of the substrate at the time of movement of the nozzle may be set at 1000 rpm or less. Furthermore, the discharge position of the coating solution may be shifted from the central portion of the substrate by 5 mm or more.

The control unit may further execute, before the first step, a fourth step of discharging the coating solution from the nozzle to the central portion of the substrate with the substrate being rotated at a speed lower than the rotation speed of the substrate in the first step. Further, the rotation speed of the substrate in the fourth step may be lower than the rotation speed of the substrate in the second step.

The present invention according to another aspect is a coating treatment apparatus for a substrate, including: a rotating and holding unit for holding the substrate and rotating the substrate at a predetermined speed; a nozzle for discharging a coating solution to the substrate at a predetermined timing; and a nozzle moving mechanism for moving the nozzle in a radial direction of the substrate from a position above a central portion of the substrate. The coating treatment apparatus further includes a control unit for controlling operations of the rotating and holding unit, the nozzle and the nozzle moving mechanism to execute a first step of discharging the coating solution from the nozzle to the central portion of the substrate with the substrate being acceleratingly rotated at a fixed acceleration until the rotation reaches a relatively high speed by the rotating and holding unit to apply the coating solution over the substrate; a second step of decelerating the rotation of the substrate immediately after the rotation speed of the substrate reaches the relatively high speed and rotating the substrate at a relatively low speed; and a third step of accelerating, after the second step, the rotation of the substrate to dry the coating solution on the substrate, wherein the discharge of the coating solution by the nozzle in the first step is continuously performed until a middle of the second step, and when the discharge of the coating solution is finished in the second step, the nozzle is moved to move a discharge position of the coating solution from the central portion of the substrate.

According to the present invention of another aspect, there provided is a computer-readable storage medium storing a program running on a computer of a control unit which controls a coating treatment apparatus in order to cause the coating treatment apparatus to execute the above-described coating treatment method.

Effect of the Invention

According to the present invention, a uniform coating film can be formed on a substrate, so that post processing for the coating film can be appropriately performed to improve the yield of final substrate products.

EXPLANATION OF CODES 1 coating and developing treatment system
30 resist coating unit
130 spin chuck
143 first nozzle
160 control unit
W wafer

BEST MODE FOR CARRYING OUT THE INVENTION

Figure 1:
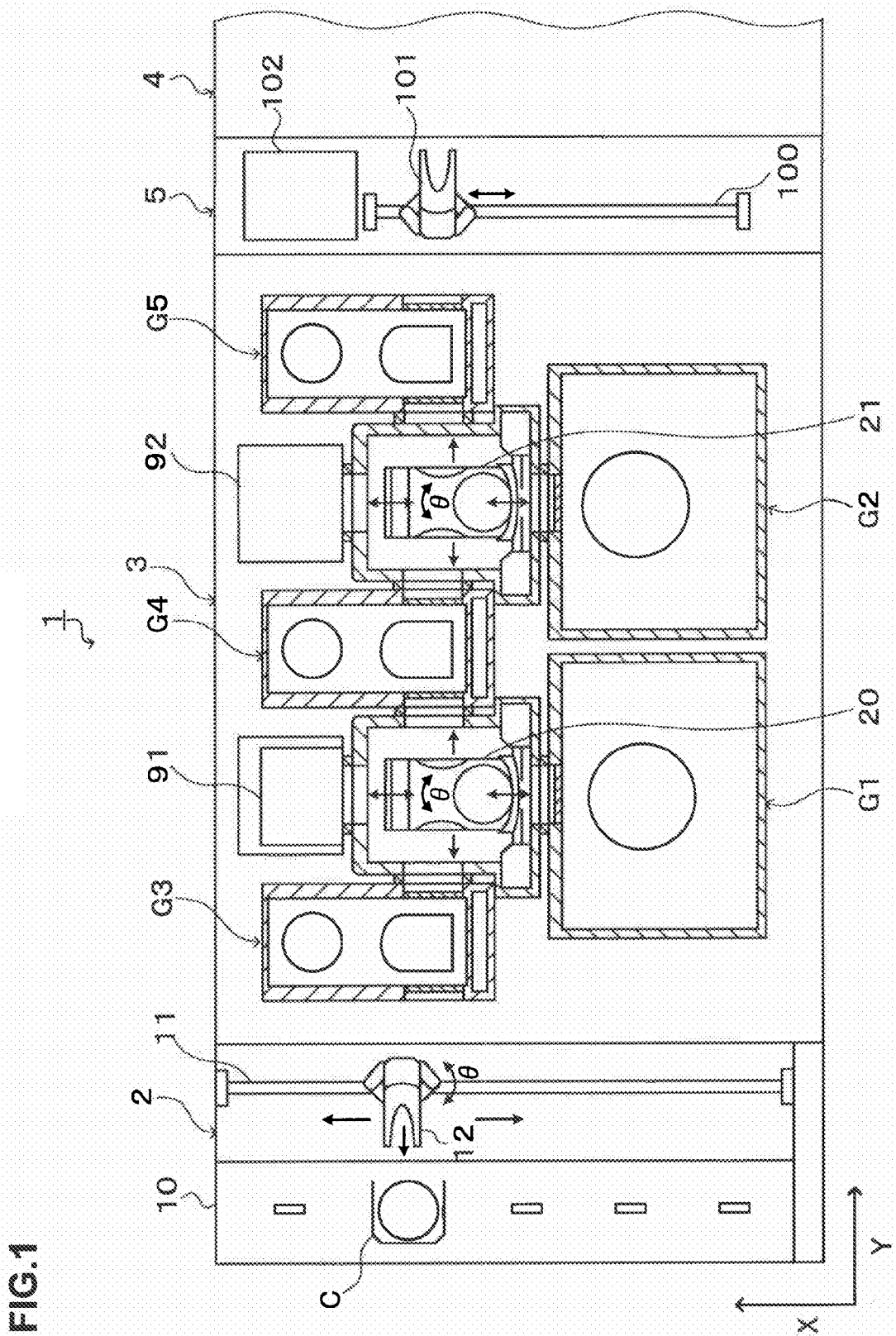
FIG. 1 A plan view showing the outline of a configuration of a coating and developing treatment system.
Figure 2:
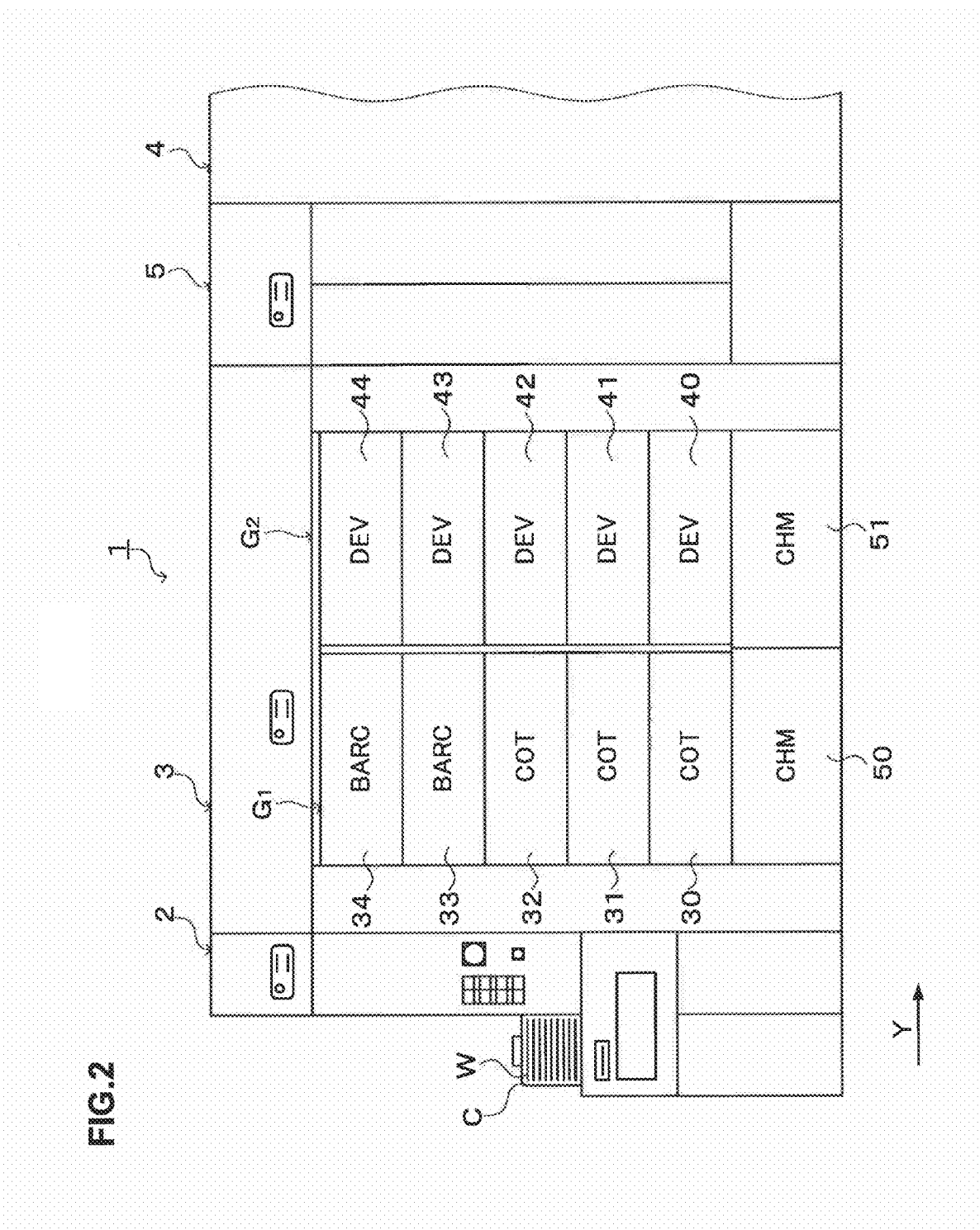
FIG. 2 A front view of the coating and developing treatment system.
Figure 3:
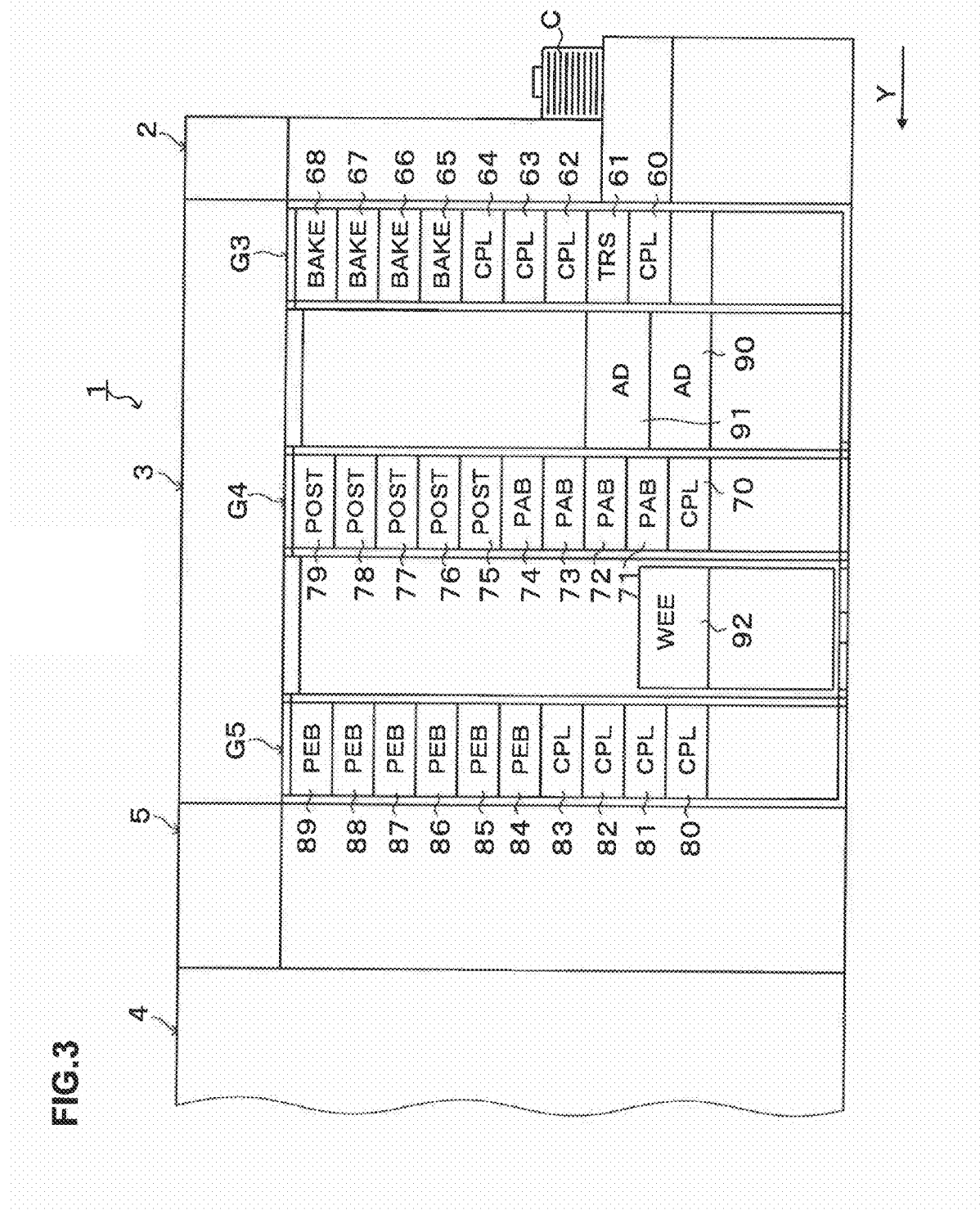
FIG. 3 A rear view of the coating and developing treatment system.

Hereinafter, a preferred embodiment of the present invention will be described. FIG. 1 is a plan view showing the outline of a configuration of a coating and developing treatment system 1 equipped with a coating treatment apparatus according to this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring a plurality of wafers W per cassette as a unit from/to the outside into/from the coating and developing treatment system 1; a processing station 3 including a plurality of various kinds of processing and treatment units each for performing predetermined processing or treatment in a manner of single wafer processing in a photolithography process; and an interface station 5 for passing the wafer W to/from an aligner 4 adjacent to the processing station 3, are integrally connected.

In the cassette station 2, a cassette mounting table 10 is provided and configured such that a plurality of cassettes C can be mounted on the cassette mounting table 10 in a line in an X-direction (a top-to-bottom direction in FIG. 1). In the cassette station 2, a wafer transfer body 12 is provided which is movable in the X-direction on a transfer path 11. The wafer transfer body 12 is also movable in an arrangement direction of the wafers W housed in the cassette C (a Z-direction; the vertical direction), and thus can selectively access the plural wafers W in each of the cassettes C. The wafer transfer body 12 is also rotatable around the axis in the vertical direction (in a θ-direction), and can access the processing and treatment units in a later-described third processing unit group G3 in the processing station 3 and transfer the wafer W to them.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side toward the interface station 5 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side toward the interface station 5 side. Between the third processing unit group G3 and the fourth processing unit group G4, a first transfer unit 20 is provided. The first transfer unit 20 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 21 is provided. The second transfer unit 21 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 30, 31, and 32 each as the coating treatment apparatus according to this embodiment, and bottom coating units 33 and 34 each for forming an anti-reflection film that prevents reflection of light at the time of exposure processing, are five-tiered in order from the bottom. In the second processing unit group G2, solution treatment units, for example, developing treatment units 40 to 44 each for supplying a developing solution to the wafer W to perform developing treatment on it are five-tiered in order from the bottom. Further, chemical chambers 50 and 51 each for supplying various kinds of treatment solutions to the solution treatment units in the processing unit groups G1 and G2 are provided on the lowermost tiers of the first processing unit group G1 and the second processing unit group G2, respectively.

In the third processing unit group G3, as shown in FIG. 3, for example, a temperature regulating unit 60 for mounting the wafer W on its temperature regulating plate and regulating the temperature of the wafer W, a transition unit 61 for passing the wafer W, temperature regulating units 62 to 64, and heating processing units 65 to 68 each for performing heating processing on the wafer W are nine-tiered in order from the bottom.

In the fourth processing unit group G4, for example, a temperature regulating unit 70, pre-baking units 71 to 74 each for performing heating processing on the wafer W after resist coating treatment, and post-baking units 75 to 79 each for performing heating processing on the wafer W after developing treatment, are ten-tiered in order from the bottom.

In the fifth processing unit group G5, a plurality of thermal processing units each for performing thermal processing on the wafer W, for example, temperature regulating units 80 to 83 and post-exposure baking units 84 to 89 each for performing heating processing on the wafer W after exposure are ten-tiered in order from the bottom.

As shown in FIG. 1, a plurality of processing and treatment units are arranged on the positive direction side in the X-direction of the first transfer unit 20, for example, adhesion units 90 and 91 each for performing hydrophobic treatment on the wafer W being two-tiered in order from the bottom as shown in FIG. 3. As shown in FIG. 1, on the positive direction side in the X-direction of the second transfer unit 21, for example, an edge exposure unit 92 is disposed which selectively exposes only the edge portion of the wafer W to light.

In the interface station 5, for example, a wafer transfer body 101 moving on a transfer path 100 extending in the X-direction and a buffer cassette 102 are provided as shown in FIG. 1. The wafer transfer body 101 is movable in the Z-direction and also rotatable in the O-direction and thus can access the aligner 4 adjacent to the interface station 5, the buffer cassette 102, and the processing and treatment units in the fifth processing unit group G5 and transfer the wafer W to them.

The aligner 4 in this embodiment performs, for example, liquid-immersion exposure processing in which with a liquid film of liquid, for example, pure water staying on the front surface of the wafer W, the resist film on the front surface of the wafer W can be exposed to light via the liquid film of the pure water.

Figure 4:
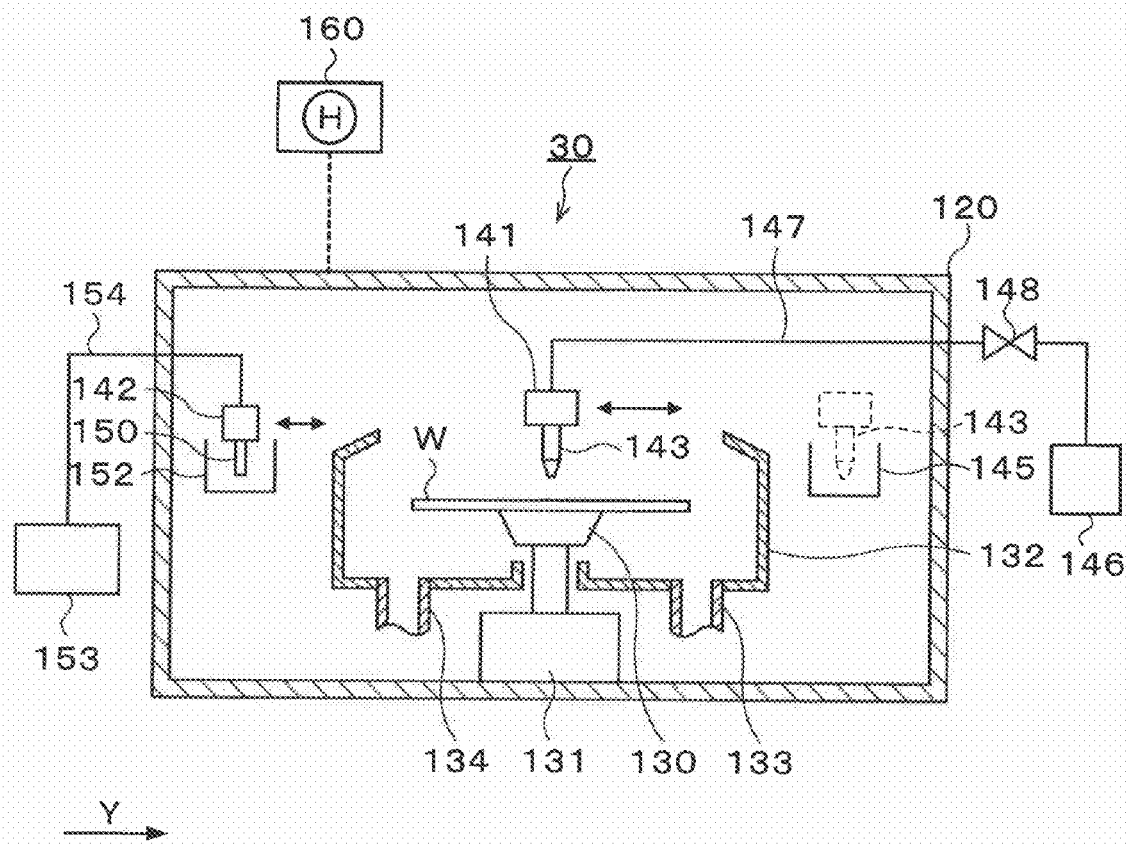
FIG. 4 An explanatory view of a longitudinal section showing the outline of a configuration of a resist coating unit.
Figure 5:
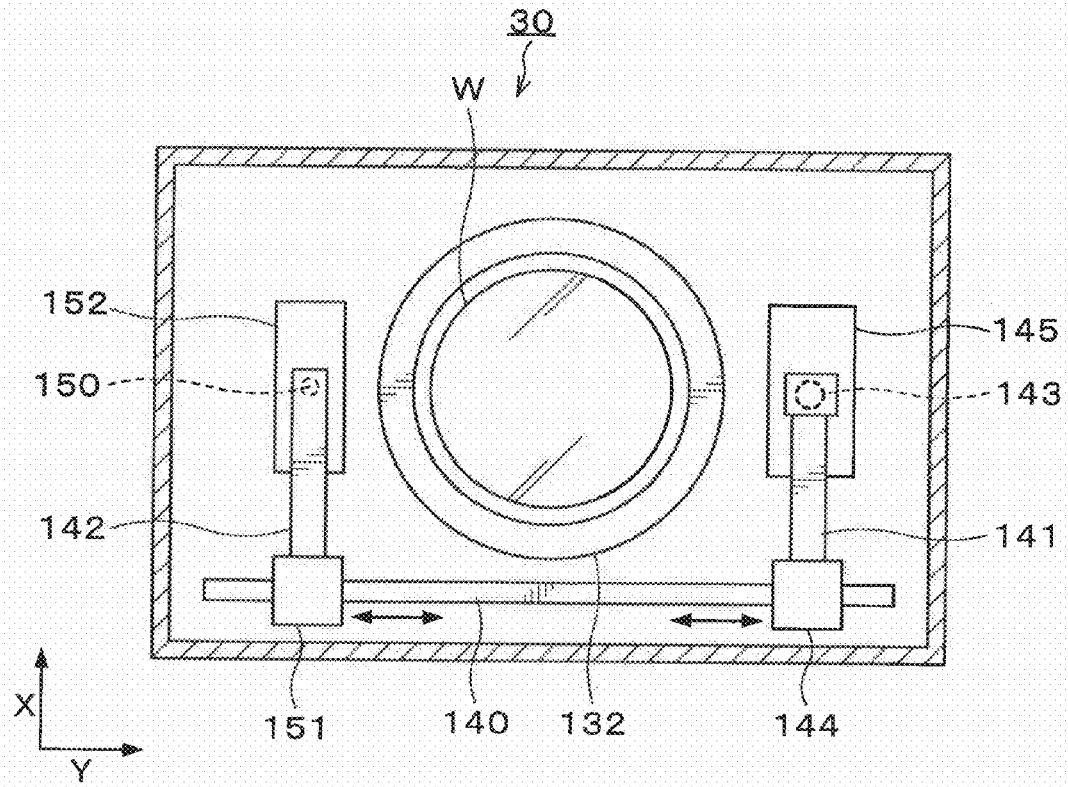
FIG. 5 An explanatory view of a transverse section showing the outline of the configuration of the resist coating unit.

Next, the configurations of the above-described resist coating units 30 to 32 will be described. FIG. 4 is an explanatory view of a longitudinal section showing the outline of the configuration of the resist coating unit 30, and FIG. 5 is an explanatory view of a transverse section showing the outline of the configuration of the resist coating unit 30.

The resist coating unit 30 has, as shown in FIG. 4, for example, a casing 120 in which a spin chuck 130 as a rotating and holding unit for holding and rotating the wafer W is provided at its central portion. The spin chuck 130 has a horizontal upper surface, and the upper surface is provided with, for example, a suction port (not shown) for sucking the wafer W. The suction through the suction port allows the wafer W to be suction-held on the spin chuck 130.

The spin chuck 130 has a chuck drive mechanism 131 equipped with, for example, a motor or the like and can rotate at a predetermined speed by means of the chuck drive mechanism 131. Further, the chuck drive mechanism 131 is provided with a raising and lowering drive source such as a cylinder, so that the spin chuck 130 can vertically move.

Around the spin chuck 130, a cup 132 is provided which receives and collects liquid splashing or dropping from the wafer W. A drain pipe 133 for draining the collected liquid and an exhaust pipe 134 for exhausting the atmosphere in the cup 132 are connected to the bottom surface of the cup 132.

As shown in FIG. 5, on the side of the negative direction in the X-direction (the downward direction in FIG. 5) of the cup 132, a rail 140 is formed which extends in a Y-direction (the right-to-left direction in FIG. 5). The rail 140 is formed, for example, from the outside on the negative direction side in the Y-direction of the cup 132 (the left direction in FIG. 5) to the outside on the positive direction side in the Y-direction (the right direction in FIG. 5). To the rail 140, for example, two arms 141 and 142 are attached.

On the first arm 141, a first nozzle 143 for discharging the resist solution as a coating solution is supported as shown in FIG. 4 and FIG. 5. The first arm 141 is movable on the rail 140 by means of a nozzle drive unit 144 shown in FIG. 5. This allows the first nozzle 143 to move from a waiting section 145 provided at the outside on the positive direction side in the Y-direction of the cup 132 to a position above a central portion of the wafer W in the cup 132 and further move in a radial direction of the wafer W above the front surface of the wafer W. The first arm 141 freely rises and lowers by means of the nozzle drive unit 144 to be able to adjust the height of the first nozzle 143. Note that the first arm 141 and the nozzle drive unit 144 constitute a "nozzle moving mechanism" in this embodiment.

To the first nozzle 143, a supply pipe 147 communicating with a resist solution supply source 146 is connected as shown in FIG. 4. In the resist solution supply source 146 in this embodiment, for example, a resist solution having a low viscosity for forming a thin resist film, for example, a resist film of 150 nm or less is stored. Further, the supply pipe 147 is provided with a valve 148 so that the discharge of the resist solution can be turned ON/OFF by opening/closing the valve 148.

On the second arm 142, a second nozzle 150 for discharging a solvent for the resist solution is supported. The second arm 142 is movable on the rail 140 by means of a nozzle drive unit 151 shown in FIG. 5 and moves the second nozzle 150 from a waiting section 152 provided at the outside on the negative direction side in the Y-direction of the cup 132 to a position above the central portion of the wafer W in the cup 132. Further, the second arm 142 freely rises and lowers by means of the nozzle drive unit 151 to be able to adjust the height of the second nozzle 150.

To the second nozzle 150, a supply pipe 154 communicating with a solvent supply source 153 is connected as shown in FIG. 4. Note that though the first nozzle 143 for discharging the resist solution and the second nozzle 150 for discharging the solvent are supported on the separate arms in the above configuration, they may be supported on the same arm, and movement and discharge timings of the first nozzle 143 and the second nozzle 150 may be controlled by controlling the movement of the arm.

The operations of a drive system such as the above-described rotation operation of the spin chuck 130, the movement operation of the first nozzle 143 by the nozzle drive unit 144, the ON/OFF operation for discharge of the resist solution of the first nozzle 143 by the valve 148, the movement operation of the second nozzle 150 by the nozzle drive unit 151 and so on are controlled by a control unit 160. The control unit 160 is composed of, for example, a computer including a CPU and a memory and can realize the resist coating treatment in the resist coating unit 30, for example, by executing programs stored in the memory. Note that various programs used to realize the resist coating treatment in the resist coating unit 30 are ones which are recorded, for example, on a storage medium H such as a computer-readable CD or the like and installed from the storage medium H into the control unit 160.

Note that the configurations of the resist coating units 31 and 32 are the same as that of the above-described resist coating unit 30, and therefore description thereof will be omitted.

Next, the coating treatment process performed in the resist coating unit 30 configured as described above will be described together with the process of the wafer processing performed in the whole coating and developing treatment system 1.

First of all, unprocessed wafers W are taken out of the cassette C on the cassette mounting table 10 one by one by the wafer transfer body 12 and transferred in sequence to the processing station 3. The wafer W is transferred to the temperature regulating unit 60 included in the third processing unit group G3 in the processing station 3 and temperature-regulated to a predetermined temperature. The wafer W is then transferred by the first transfer unit 20, for example, to the bottom coating unit 34, where an anti-reflection film is formed. The wafer W is transferred by the first transfer unit 20, for example, to the heating processing unit 65 and the temperature regulating unit 70 in sequence, and subjected to predetermined processing in each of the units. The wafer W is then transferred by the first transfer unit 20, for example, to the resist coating unit 30.

Figure 6:
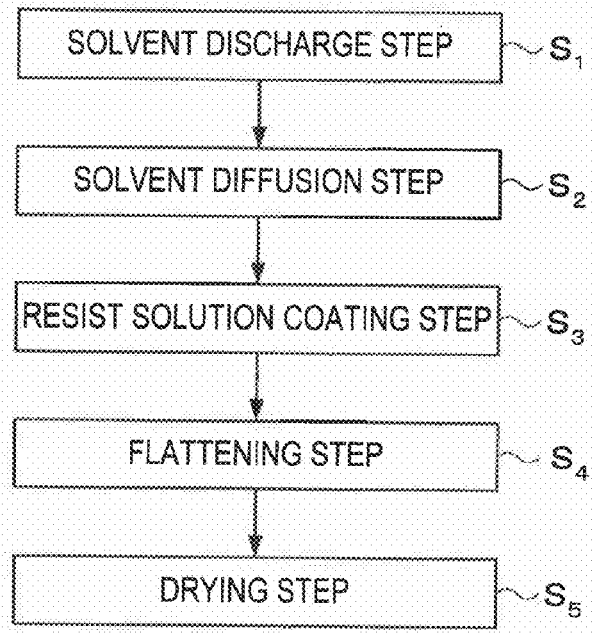
FIG. 6 A flowchart showing main steps of the resist coating treatment.
Figure 7:
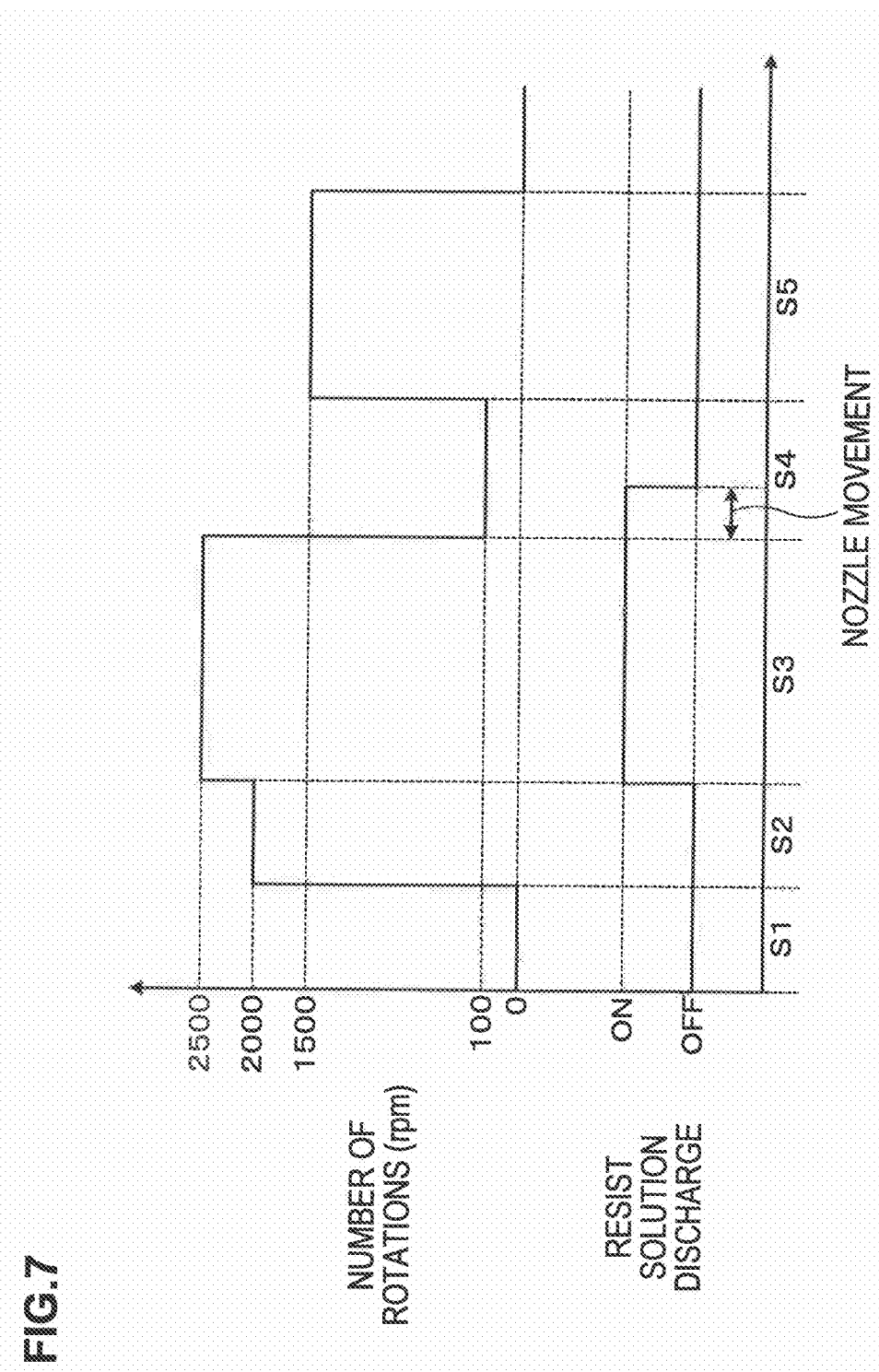
FIG. 7 A graph showing the rotation speed of the wafer in each of the steps of the resist coating treatment.

FIG. 6 is a flowchart showing main steps of the coating treatment process in the resist coating unit 30. FIG. 7 is a graph showing the rotation speed of the wafer W and the discharge timing of the resist solution in each of the steps of the coating treatment process.

The wafer W transferred in the resist coating unit 30 is first suction-held on the spin chuck 130 as shown in FIG. 4. Subsequently, the second nozzle 150 at the waiting section 152 is moved by the second arm 142 to the position above the central portion of the wafer W. Then, with the wafer W stopped, a predetermined amount of solvent is discharged from the second nozzle 150 and supplied to the central portion of the wafer W (Step S1 in FIG. 6 and FIG. 7). Thereafter, the wafer W is rotated by the spin chuck 130 at a medium speed of, for example, about 2000 rpm as shown in FIG. 7, whereby the solvent on the wafer W is diffused on the entire front surface of the wafer W so that the solvent is applied over the front surface of the wafer W (Step S2 in FIG. 6 and FIG. 7). In this event, for example, the first nozzle 143 at the waiting section 145 is moved by the first arm 141 to the position above the central portion of the wafer W.

Figure 8:
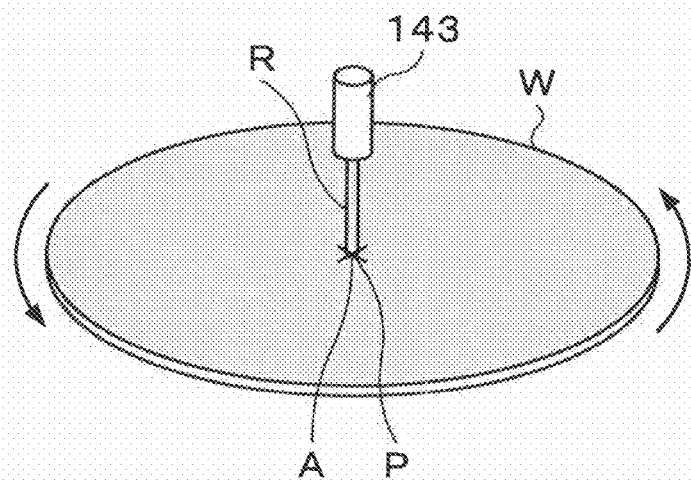
FIG. 8 An explanatory view showing a state of a resist solution being discharged from a first nozzle to a central portion of a wafer.

Thereafter, the rotation of the wafer W is accelerated to a high speed of, for example, about 2500 rpm as shown in FIG. 7, and concurrently with the acceleration, the valve 148 is opened to start discharge of the resist solution from the first nozzle 143. Thus, a resist solution R is discharged from the first nozzle 143 to a central portion A of the wafer W rotated at the high speed as shown in FIG. 8, and the resist solution R is diffused on the entire front surface of the wafer W by the centrifugal force, so that the resist solution R is applied over the front surface of the wafer W (Step S3 in FIG. 6 and FIG. 7 (a first step in the present invention)). Note that a resist solution having a viscosity of, for example, 2 cp or less for thin film coating is used for the resist solution at this time.

After the coating step S3 of the resist solution for a predetermined time is finished, the rotation of the wafer W is decelerated to a low speed of, for example, 1000 rpm or less, more preferably, about 100 rpm as shown in FIG. 7, whereby the resist solution on the wafer W is evened and flattened (Step S4 in FIG. 6 and FIG. 7 (a second step in the present invention)).

Figure 9:
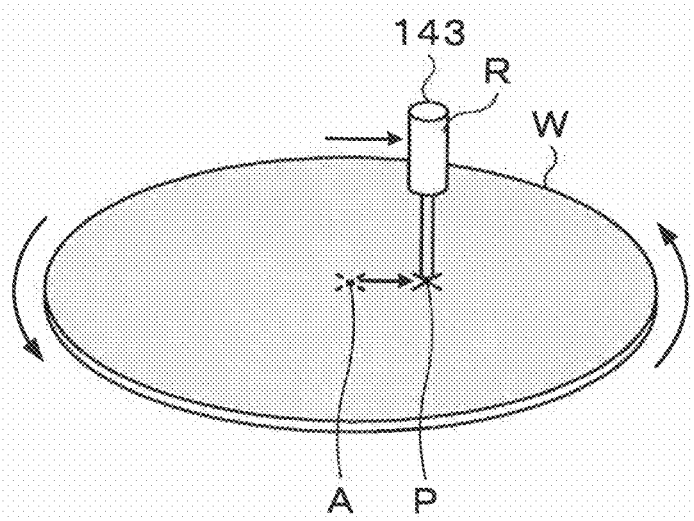
FIG. 9 An explanatory view showing a state of a resist solution discharge position shifted from the central portion of the wafer by moving the first nozzle.

Concurrently with the finish of the coating step S3 of the resist solution, the first nozzle 143 is moved, while continuously discharging the resist solution R as shown in FIG. 9, by the first arm 141 in a radial direction of the wafer W from the position above the central portion A of the wafer W by a predetermined distance, for example, 5 mm or more, more preferably, about 5 to 30 mm. Thus, a resist solution discharge position P on the front surface of the wafer W is shifted from the central portion A on the wafer W (namely, moved from the central portion). Note that the rotation speed of the wafer W in this event is maintained at a low speed of 100 rpm. The first nozzle 143 is stopped at a position where it is shifted from the position above the central portion A of the wafer W by the predetermined distance, and at this time the valve 148 is closed to stop the discharge of the resist solution. Thereafter, the wafer W is continuously rotated at the low speed, whereby the resist solution on the wafer W is evened and flattened. More specifically, the discharge of the resist solution is performed from the coating step S3 of the resist solution until a middle of the flattening step S4 of the resist solution as shown in FIG. 7, and when the discharge of the resist solution is finished in the flattening step S4, the first nozzle 143 is moved to shift the resist solution discharge position P from the central portion A of the wafer W (namely, move it from the central portion).

After the flattening step S4 of the resist solution for a predetermined time is finished, the rotation of the wafer W is accelerated to a medium speed of, for example, about 1500 rpm as shown in FIG. 7, whereby the resist solution on the wafer W is dried (Step S5 in FIG. 6 and FIG. 7 (a third step in the present invention)). Thus, a thin resist film of, for example, about 150 nm or less is formed on the wafer W.

After the drying of the wafer W is finished, the rotation of the wafer W is stopped and the wafer W is transferred out from the top of the spin chuck 130, whereby a series of resist coating treatment is finished.

After the resist coating treatment, the wafer W is transferred by the first transfer unit 20, for example, to the pre-baking unit 71 and subjected to pre-baking. The wafer W is subsequently transferred by the second transfer unit 21 to the edge exposure unit 92 and the temperature regulating unit 83 in sequence and subjected to predetermined processing in each of the units. Thereafter, the wafer W is transferred by the wafer transfer body 101 in the interface station 5 to the aligner 4 and subjected to liquid-immersion exposure processing. The wafer W is then transferred by the wafer transfer body 101, for example, to the post-exposure baking unit 84 and subjected to post-exposure baking, and then transferred by the second transfer unit 21 to the temperature regulating unit 81 and temperature-regulated. The wafer W is then transferred to the developing treatment unit 40, where the resist film on the wafer W is developed. After the development, the wafer W is transferred by the second transfer unit 21 to the post-baking unit 75 and subjected to post-baking. The wafer W is then transferred to the temperature regulating unit 63 and temperature-regulated. Then, the wafer W is transferred by the first transfer unit 20 to the transition unit 61 and returned by the wafer transfer body 12 to the cassette C, whereby a series of wafer processing is finished.

According to the above embodiment, the discharge of the resist solution by the first nozzle 143 in the coating step S3 of the resist solution is continuously performed until a middle of the flattening step S4 of the resist solution, in which the resist solution discharge position P is shifted from the central portion A of the wafer W by the movement of the first nozzle 143 at the time of finishing the discharge of the resist solution. This ensures that even when a droplet of the resist solution drops at the time of finishing the discharge from the first nozzle 143, the droplet drops onto the wafer W rotated at the low speed in the flattening step S4, so that quick drying of the droplet is prevented. In addition, the droplet of the resist solution drops to the position P shifted from the central portion A of the wafer W, whereby the resist solution is appropriately spread within the wafer by the centrifugal force stronger than that at the central portion of the wafer W. As a result of this, a uniform resist film can be finally formed on the entire front surface of the wafer W without forming coating mottles near the central portion of the wafer W as in the prior art. The results of experiments verifying this effect are shown below.

Figure 10:
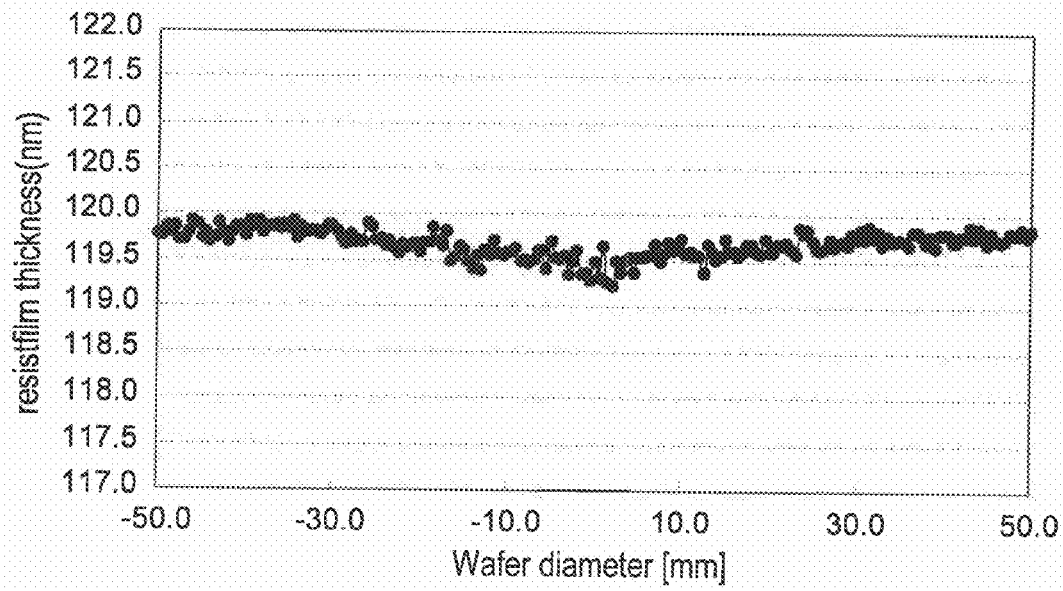
FIG. 10 A graph showing the result of measuring the thickness of a resist film within the wafer when using the coating treatment process in this embodiment.
Figure 11:
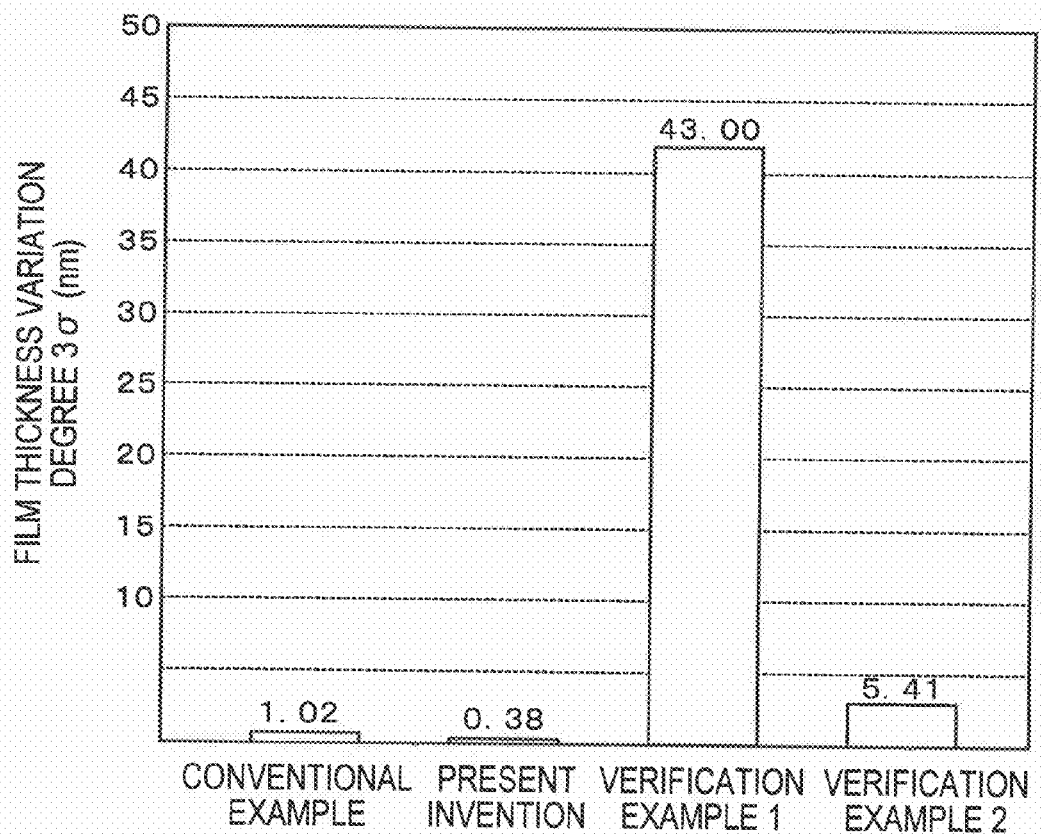
FIG. 11 A graph showing the variation degrees of the thickness of the resist film within the wafer when using various coating treatment processes.
Figure 16:
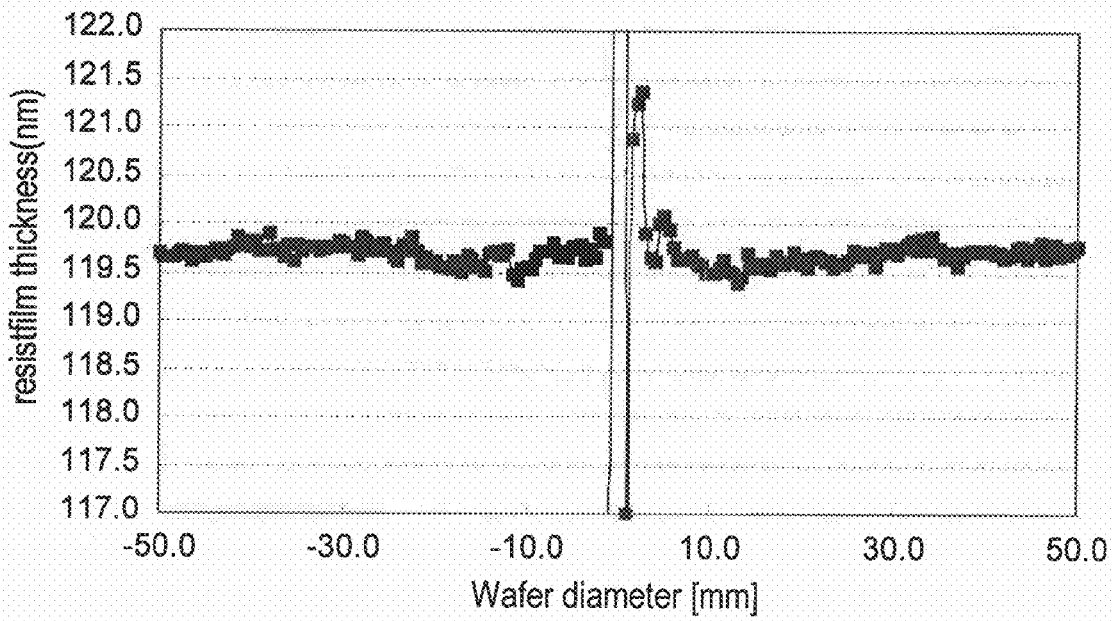
FIG. 16 A graph showing the result of measuring the thickness of the resist film within the wafer when using the coating treatment process in a conventional example.
Figure 17:
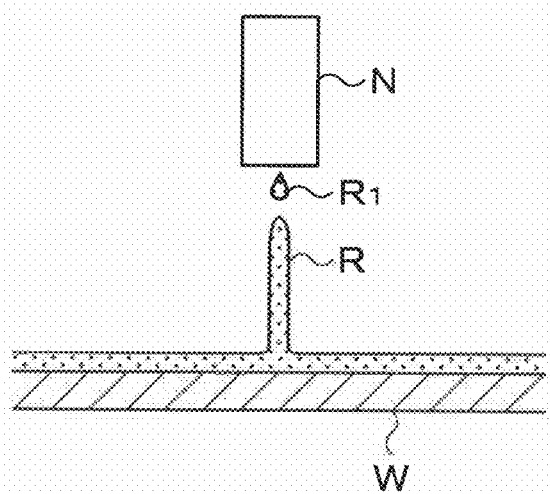
FIG. 17 An explanatory view showing the appearance of the resist solution dropping in the form of a droplet from the nozzle.

FIG. 10 shows the result of an experiment of measuring the thickness of the resist film within the wafer when using the coating treatment process of this embodiment. From the experimental result, it can be confirmed that the resist film has been formed uniformly within the wafer without fluctuations in thickness of the resist film at the central portion of the wafer W as compared to the case (conventional example shown in FIG. 16) where the nozzle was not moved from the position above the central portion of the wafer W after the discharge of the resist solution was finished in the coating step S1 as in the prior art. Further, FIG. 11 is a graph showing the variation degrees (3σ) of the thickness of the resist film near the center of the wafer when using various coating treatment processes. It can be confirmed also from FIG. 11 that the variations in thickness of the resist film have been drastically decreased to be within 0.5 nm or less in the case of using the coating treatment process of this embodiment (in the case of the present invention) as compared to the case of the conventional example.

The timing of finishing the discharge of the resist solution is set at the middle of the flattening step S4 and the resist solution discharge position P is shifted by moving the first nozzle 143 immediately before the discharge of the resist solution is finished in this embodiment. Whether the timing of finishing the discharge of the resist solution is appropriate or not and whether the shifting of the resist solution discharge position P is necessary or not in this case are verified here.

Figure 12:
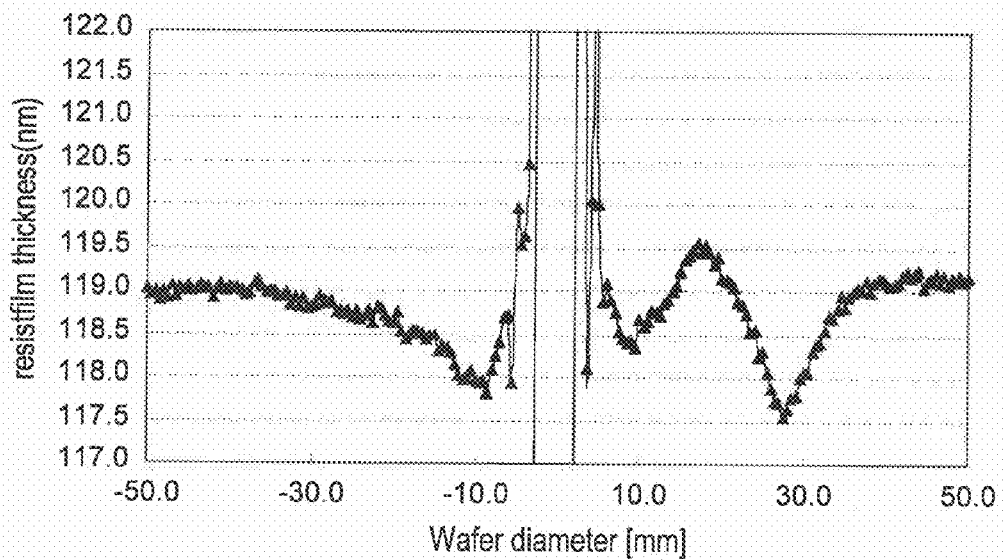
FIG. 12 A graph showing the result of measuring the thickness of the resist film within the wafer when using the coating treatment process in a verification example 1.

FIG. 12 shows the result of an experiment of measuring the thickness of the resist film within the wafer when the resist solution discharge position P was shifted from the central portion of the wafer W by moving the nozzle in the coating step S3 and then the discharge of the resist solution was finished concurrently with the finish of the coating step S3, that is, when the timing of finishing the discharge of the resist solution was at the finish of the coating step S3 and the resist solution discharge position P was shifted. Further, the variation degree (3σ) of the thickness of the resist film near the center of the wafer in this case (verification example 1) is shown in FIG. 11.

Figure 13:
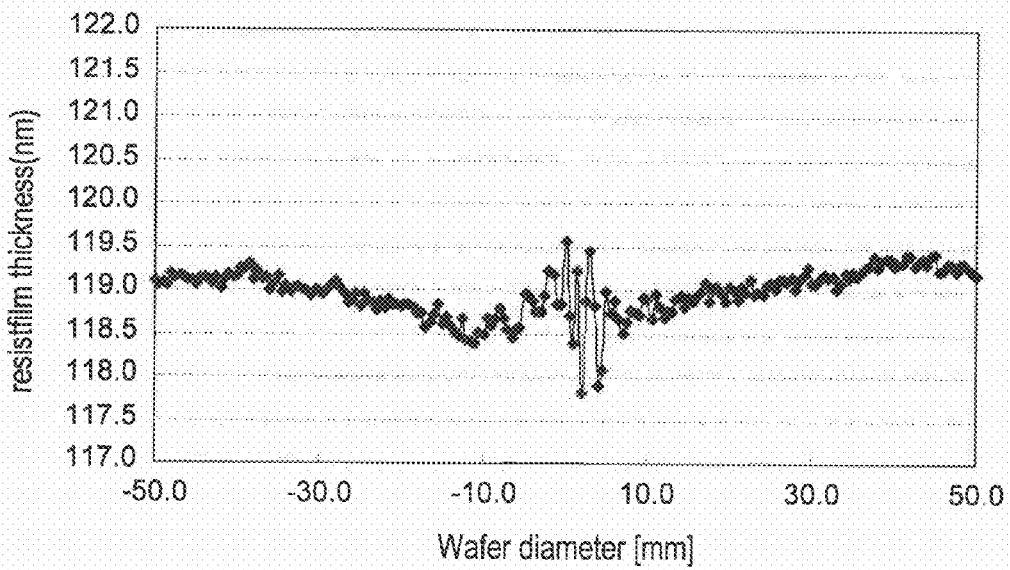
FIG. 13 A graph showing the result of measuring the thickness of the resist film within the wafer when using the coating treatment process in a verification example 2.

FIG. 13 shows the result of an experiment of measuring the thickness of the resist film within the wafer when the resist solution was discharged from the coating step S3 until a middle of the flattening step S4 with the nozzle being fixed at the position above the central portion of the wafer W, that is, when the timing of finishing the discharge of the resist solution was at the middle of the flattening step S4 and the resist solution discharge position P was not shifted. The variation degree (3σ) of the thickness of the resist film near the center of the wafer in this case (verification example 2) is shown in FIG. 11.

According to the verification example 1 shown in FIG. 11 and FIG. 12, it can be confirmed that when the resist solution discharge position P is shifted in the coating step S3 and the discharge of the resist solution is finished, the film thickness of the resist solution near the center of the wafer W significantly varies and the variation degree within the wafer also extremely increases. This can be considered to be caused from insufficient spreading and thus drying of the resist solution discharged to the central portion of the wafer.

According to the verification example 2 shown in FIG. 11 and FIG. 13, it can be confirmed that when the resist solution is discharged until a middle of the flattening step S4 without shifting the resist solution discharge position P, the film thickness of the resist solution near the center of the wafer W is not different from that in the conventional example and the variation degree within the wafer is not improved.

Accordingly, it can be confirmed that the uniformity of the resist film within the wafer can be drastically improved only after the discharge of the resist solution is performed until a middle of the flattening step S4 and the resist solution discharge position P is shifted from the central portion of the wafer W immediately before the discharge of the resist solution is finished as in this embodiment.

Figure 14:
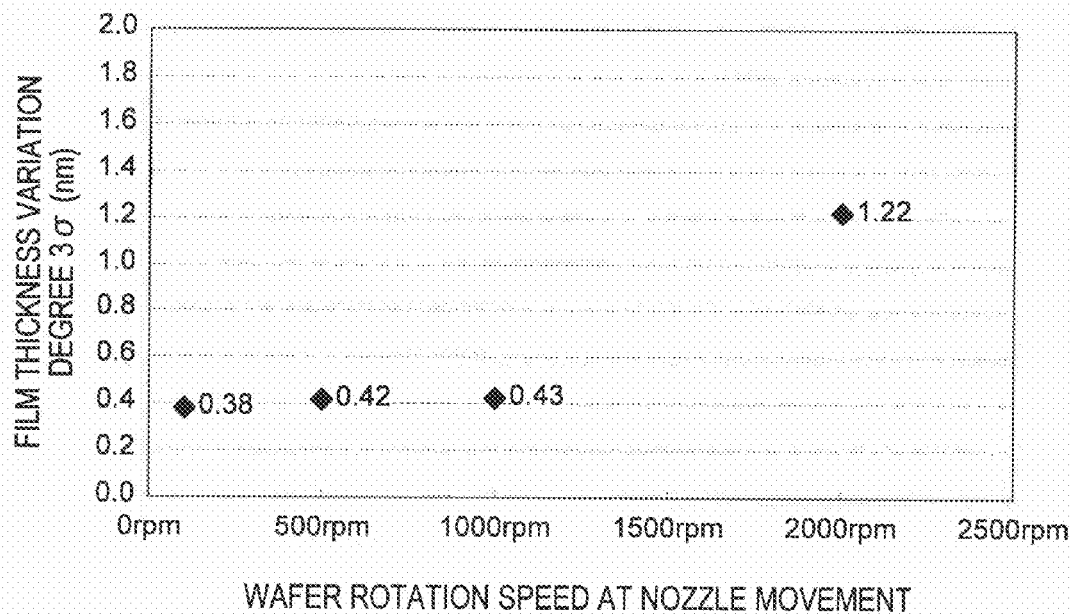
FIG. 14 A graph showing the variation degree of the thickness of the resist film near the center of the wafer when the rotation speed of the wafer at the time of movement of the nozzle is varied.

FIG. 14 is the result of an experiment showing the variation degrees (3σ) of the thickness of the resist film near the center of the wafer when the rotation speed of the wafer W at the time of movement of the first nozzle 143 is varied. It is found that when the rotation speed is set to 1000 rpm or less, the variation degree of the thickness of the resist film takes a very small value of 0.5 nm or less, as shown in FIG. 14. Accordingly, by setting the rotation speed of the wafer W to 1000 rpm or less when the nozzle 143 is shifted from the position above the central portion A of the wafer W as in the above embodiment, the variations in thickness of the resist film can be drastically improved. Note that the rotation speed of the wafer W at the time of moving the nozzle is preferably set to 50 rpm or more in consideration of the flattening of the film in the flattening step S4.

Figure 15:
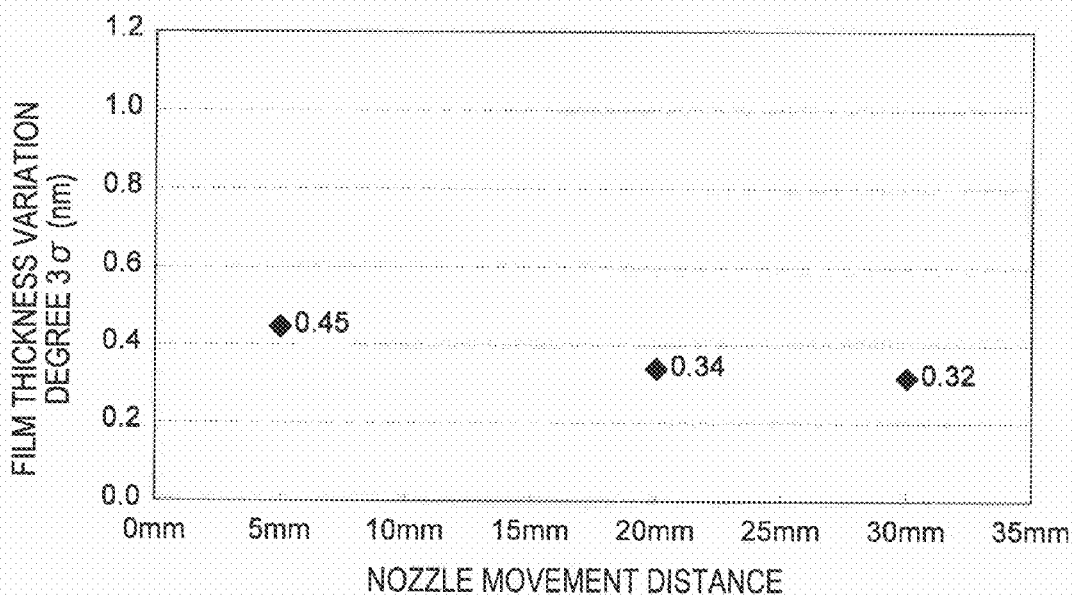
FIG. 15 A graph showing the variation degree of the thickness of the resist film near the center of the wafer when the shift distance of the nozzle is varied.

Further, FIG. 15 is the result of an experiment showing the variation degree (3σ) of the thickness of the resist film near the center of the wafer when the shift amount of the first nozzle 143 is varied. It is found that when the first nozzle 143 is shifted by 5 mm or more, the variation degree of the thickness of the resist film takes a very small value of 0.5 nm or less, as shown in FIG. 15. Accordingly, by shifting the resist solution discharge position P from the central portion A of the wafer W by 5 mm or more as in the above embodiment, the variations in the resist film can be drastically improved.

Though the time of starting the movement of the fist nozzle 143 is at the same time of the finish of the coating step S3 in the above embodiment, the timing of starting the movement may be before the finish of the coating step S3. This makes it possible to finish the movement of the first nozzle 143 at an earlier stage and to finish the discharge of the resist solution at an accordingly earlier stage in the flattening step S4. As a result of this, the amount of the resist solution used in the whole process can be decreased to reduce the cost. Note that the movement of the first nozzle 143 is more preferably started after 50% or more of the coating step S3 is finished in consideration of diffusion of the resist solution over the entire surface of the wafer.

Figure 18:
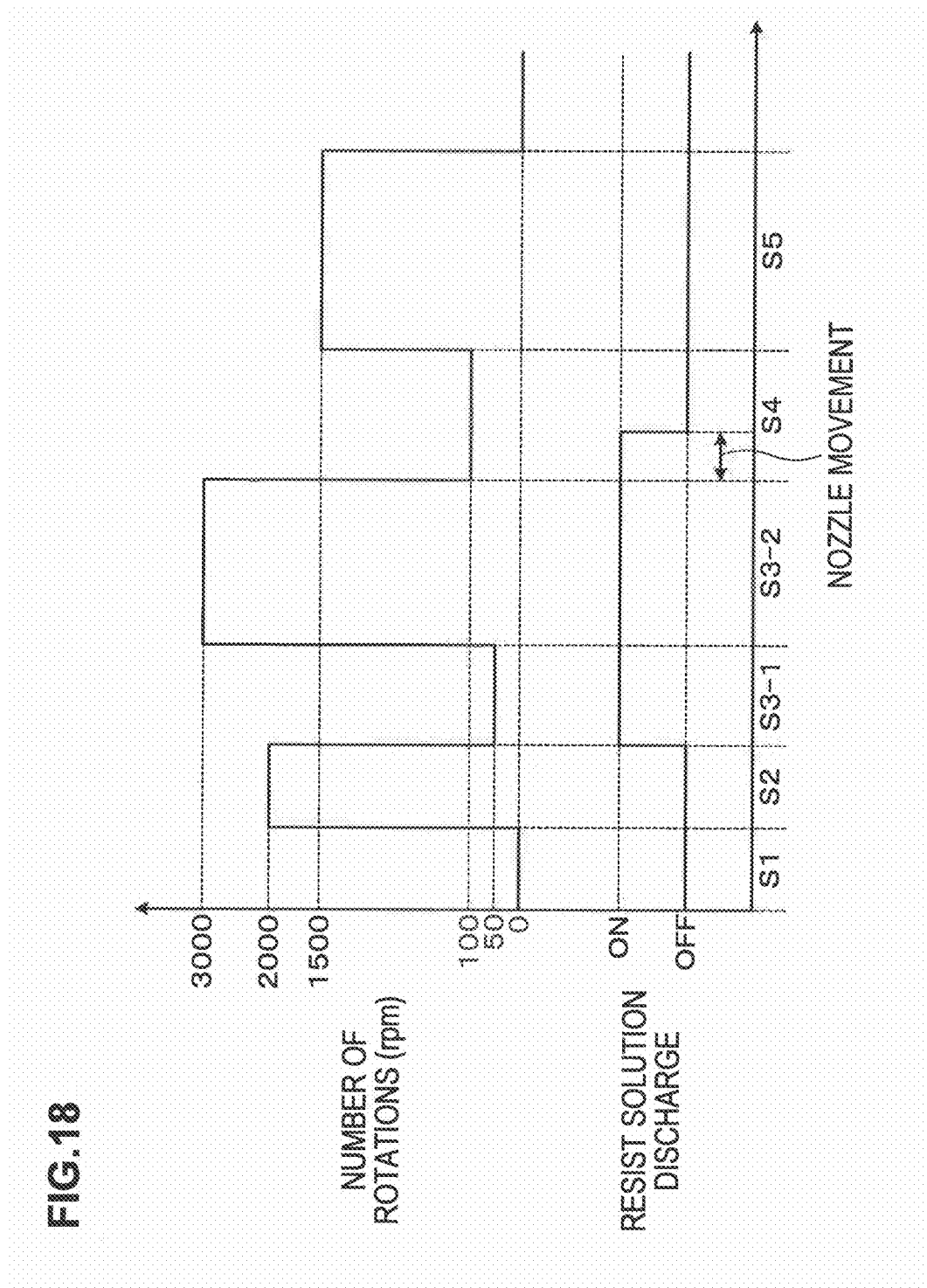
FIG. 18 A graph showing the rotation speed of the wafer in each of the steps of the resist coating treatment.

Though the discharge of the resist solution is started concurrently with the acceleration of the rotation of the wafer W to a high speed in the coating step S3 of the resist solution in the above embodiment, the wafer W may be rotated at a low speed before the wafer W is rotated at the high speed, and the discharge of the resist solution may be started to the wafer W during the rotation at the low speed as shown in FIG. 18. For example, after the discharge step S1 and the diffusion step S2 of the solvent are finished, the rotation of the wafer W is decelerated to a low speed of, for example, 100 rpm or less, more preferably, 50 rpm. Concurrently with the deceleration, the discharge of the resist solution is started from the fist nozzle 143 and the resist solution is discharged for a predetermined time (Step S3-1 in FIG. 18 (a fourth step in the present invention)). Thereafter, the rotation of the wafer W is accelerated to a high speed of, for example, 4000 rpm or less, more preferably, 3000 rpm, whereby the resist solution is diffused over the entire front surface of the wafer W by the centrifugal force. In this event, the resist solution is kept discharged to the wafer W during the rotation at the high speed (Step S3-2 in FIG. 18). Thereafter, the flattening step S4 and a drying step S5 of the resist solution are performed on the wafer W. Note that the discharge step S1 and the diffusion step S2 of the solvent, the flattening step S4 of the resist solution, and the drying step S5 of the resist solution in this embodiment are performed in the same recipes as those in the foregoing embodiment respectively. Further, the movement of the first nozzle 143 is also the same as that in the foregoing embodiment, in which the first nozzle 143 starts to move after the coating step S3-1 is finished and moves to a predetermined position above the wafer W in the flattening step S4.

Figure 19:
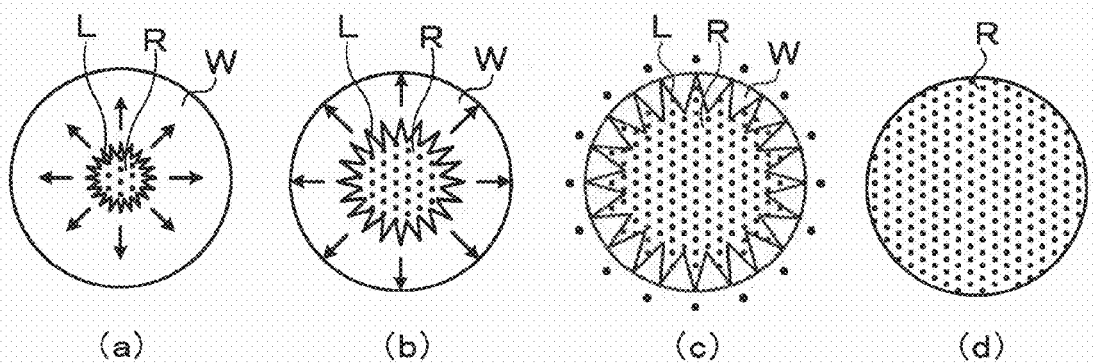
FIG. 19 An explanatory view showing the way for the resist solution to spread on the wafer.
Figure 20:
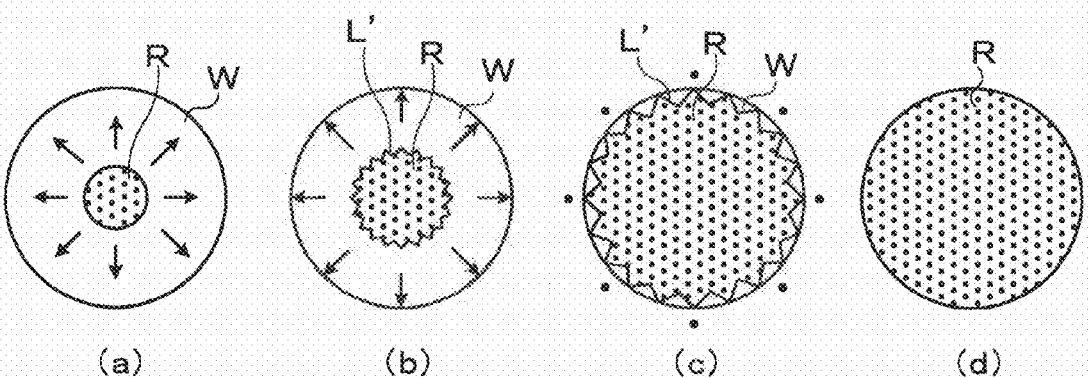
FIG. 20 An explanatory view showing the way for the resist solution to spread on the wafer.

The appearance of the resist solution spreading on the wafer W in this embodiment will be described in comparison with the foregoing embodiment. FIG. 19 shows the way for the resist solution R to spread on the wafer W in the foregoing embodiment, and FIG. 20 shows the way for the resist solution R to spread on the wafer W in this embodiment.

For example, when the rotation speed of the wafer W is instantaneously increased to rotate the wafer W at the high speed from the beginning as in the coating step S3 of the foregoing embodiment, a strong centrifugal force exerts on the resist solution R immediately after the resist solution R is discharged to the central portion of the wafer W. Therefore, the resist solution R is irregularly spread outward in the shape of streaks, resulting in the appearance of long acute streaks L in a radial pattern (FIG. 19(a)). Thereafter, the resist solution R is spread outward on the wafer W (FIG. 19(b) and FIG. 19(c)). The resist solution R is discharged until the streaks L disappear from the top of the wafer W, whereby the resist solution R is applied uniformly on the wafer W (FIG. 19(d)).

On the other hand, when the wafer W is once rotated at the low speed and then rotated at the high speed as in the coating steps S3-1 and S3-2 of this embodiment, any strong centrifugal force does not exert on the resist solution R on the wafer W because the rotation speed of the wafer W is the low speed immediately after the resist solution R is discharged to the central portion of the wafer W in the coating step S3-1. For this reason, the resist solution R is substantially evenly spread outward (FIG. 20(a)). Thus, even if the wafer W is thereafter rotated at the high speed in the coating step S3-2 to spread the resist solution R outward, streaks L' appearing because of the centrifugal force exerting on the resist solution R become shorter than the streaks L in the foregoing embodiment, and the shapes of the streaks L' themselves have obtuse tips (FIG. 20(b) and FIG. 20(c)). Then, the resist solution R is discharged until the streaks L disappear from the top of the wafer W, whereby the resist solution R is uniformly applied over the wafer W (FIG. 20(d)).

According to the above embodiment, the streaks L' appearing in the resist solution R can be made shorter than the streaks L in the foregoing embodiment, whereby the amount of the resist solution R used can be made much smaller than that in the foregoing embodiment.

Figure 21:
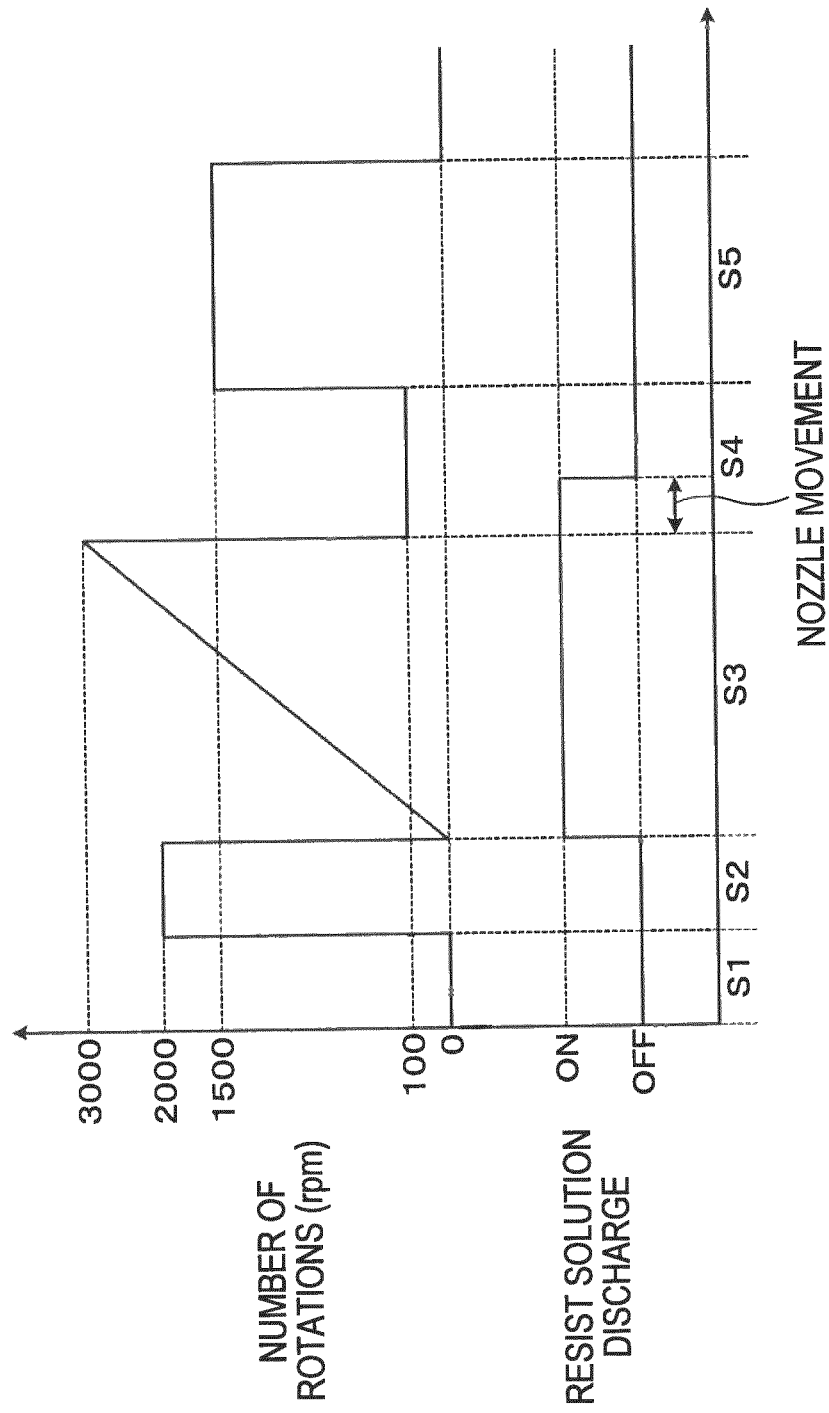
FIG. 21 A graph showing the rotation speed of the wafer in each of the steps of the resist coating treatment.

Though the discharge of the resist solution is started concurrently with the acceleration of the rotation of the wafer W to the high speed in the coating step S3 of the resist solution in the above embodiment, the rotation of the wafer W may be once stopped before the rotation of the wafer W reaches the high speed and the discharge of the resist solution to the wafer W may be started concurrently with the stop as shown in FIG. 21. For example, after the discharge step S1 and the diffusion step S2 of the solvent are finished, the rotation of the wafer W is once stopped, and then the rotation of the wafer W is accelerated at a fixed acceleration. Concurrently with the stop of the rotation of the wafer W, the discharge of the resist solution from the first nozzle 143 is started, and the resist solution is kept discharged while the rotation of the wafer W is accelerated to a high speed of, for example, 4000 rpm or less, more preferably, 3000 rpm (Step S3 in FIG. 21). Then, after the rotation of the wafer W reaches the high speed, the rotation is immediately decelerated to the low speed, at which the flattening step S4 of the resist solution and the drying step S5 of the resist solution are performed on the wafer W. Note that the discharge step S1 and the diffusion step S2 of the solvent, the flattening step S4 of the resist solution, and the drying step S5 of the resist solution in this embodiment are performed in the same recipes as those in the foregoing embodiment respectively. Further, the movement of the first nozzle 143 is also the same as that in the foregoing embodiment, in which the first nozzle 143 starts to move after the coating step S3 is finished and moves to a predetermined position above the wafer W in the flattening step S4.

Also in this case, the discharge of the resist solution onto the wafer W is started concurrently with the stop of the rotation of the wafer W and then the rotation of the wafer W is accelerated at a fixed acceleration in the coating step S3 of the resist solution, so that the rotation speed of the wafer W immediately after the resist solution is discharged is the low speed, whereby the resist solution is substantially uniformly spread outward. Accordingly, the amount of the resist solution used can be made much smaller than that in the above-described embodiment.

Preferred embodiments of the present invention have been described above with reference to the accompanying drawings, but the present invention is not limited to the embodiments. It should be understood that various changes and modifications are readily apparent to those skilled in the art within the spirit as set forth in claims, and those should also be covered by the technical scope of the present invention.

Though the resist solution having a low viscosity for forming a relatively thin resist film of 150 nm or less is used in the above-described embodiments, the present invention is also applicable to the case of using a resist solution having a relatively high viscosity for forming a resist film thicker than 150 nm. Further, the present invention has been described taking the coating treatment of the resist solution as an example in the above-described embodiments, the present invention is also applicable to the coating treatment of coating solutions other than the resist solution, such as coating solutions for forming an anti-reflection film, an SOG (Spin On Glass) film, an SOD (Spin On Dielectric) film and the like. Though the above embodiments are examples for performing the coating treatment on the wafer W, the present invention is also applicable to the coating treatment for substrates other than the wafer, such as an FPD (Flat Panel Display), a mask reticle for a photomask, and the like.

INDUSTRIAL APPLICABILITY

The present invention is useful in applying a coating solution uniformly within a substrate.

What is claimed:

1. A coating treatment method for a substrate, comprising:
a first step of discharging a coating solution from a nozzle to a central portion of the substrate with the substrate being rotated at a relatively high speed to apply the coating solution over the substrate;
a second step of decelerating, after said first step, the rotation of the substrate and rotating the substrate at a relatively low speed; and
a third step of accelerating, after said second step, the rotation of the substrate to dry the coating solution on the substrate,
wherein the discharge of the coating solution by the nozzle in said first step is continuously performed until a middle of said second step, and before the discharge of the coating solution is finished in said second step, the nozzle is moved to move a discharge position of the coating solution from the central portion of the substrate.

2. The coating treatment method as set forth in claim 1, further comprising:
a fourth step of discharging, before said first step, the coating solution from the nozzle to the central portion of the substrate with the substrate being rotated at a speed lower than the rotation speed of the substrate in said first step.

3. The coating treatment method as set forth in claim 2, wherein the rotation speed of the substrate in said fourth step is lower than the rotation speed of the substrate in said second step.

4. The coating treatment method as set forth in claim 1, wherein the movement of the nozzle is started concurrently with finish of said first step.

5. The coating treatment method as set forth in claim 1, wherein the rotation speed of the substrate at the time of movement of the nozzle is 1000 rpm or less.

6. The coating treatment method as set forth in claim 1, wherein the discharge position of the coating solution is moved from the central portion of the substrate by 5 mm or more by the movement of the nozzle.

7. The coating treatment method as set forth in claim 1, wherein the movement of the nozzle is started after 50% or more of the second step is finished.

8. A coating treatment method for a substrate, comprising:
- a first step of discharging a coating solution from a nozzle to a central portion of the substrate with the substrate being acceleratingly rotated at a fixed acceleration until the rotation reaches a relatively high speed to apply the coating solution over the substrate;
- a second step of decelerating the rotation of the substrate immediately after the rotation speed of the substrate reaches the relatively high speed and rotating the substrate at a relatively low speed; and
- a third step of accelerating, after said second step, the rotation of the substrate to dry the coating solution on the substrate,
- wherein the discharge of the coating solution by the nozzle in said first step is continuously performed until a middle of said second step, and before the discharge of the coating solution is finished in said second step, the nozzle is moved to move a discharge position of the coating solution from the central portion of the substrate.

* * * * *